United States Patent [19]

Bayraktaroglu

[11] Patent Number: 4,525,732

[45] Date of Patent: Jun. 25, 1985

[54] DISTRIBUTED IMPATT STRUCTURE

[75] Inventor: Burhan Bayraktaroglu, Plano, Tex.

[73] Assignee: Texas Instruments Incorporated, Dallas City, Tex.

[21] Appl. No.: 528,210

[22] Filed: Aug. 31, 1983

[51] Int. Cl.³ .......................... H01P 1/15; H01P 3/08; H01L 29/90; H01L 27/13
[52] U.S. Cl. ..................................... 357/13; 333/247; 331/107 R; 330/287; 357/51; 357/57; 357/58; 357/68
[58] Field of Search ........................ 333/247, 216, 214; 357/13, 57, 58, 3, 51, 68; 331/107 R, 107 SL, 107 DP; 330/53, 56, 286, 287

[56] References Cited

U.S. PATENT DOCUMENTS 3,346,825 10/1967 Scott et al. .............................. 357/58

FOREIGN PATENT DOCUMENTS 1493602 11/1977 United Kingdom .................. 357/13
2002582 2/1979 United Kingdom .................. 357/13

OTHER PUBLICATIONS

Franz et al., I.E.E.E. Transactions on Microwave Theory and Techniques, vol. MTT-26, No. 11, Nov. 1978, pp. 861-865.
Franz et al., I.E.E.E. Transactions on Microwave Theory and Techniques, vol. MTT-28, No. 3, Mar. 1980, pp. 215-218.
Hambleton et al., International Journal of Electronics, vol. 35, No. 2, 1973, pp. 225-244.

Primary Examiner—William D. Larkins
Assistant Examiner—Andrew J. Telesz, Jr.
Attorney, Agent, or Firm—Robert Groover, III; Melvin Sharp; James T. Comfort

[57] ABSTRACT

In a distributed IMPATT structure, power is coupled out through a side contact. That is, in previously proposed distributed IMPATT structures the gain medium (the active region of the IMPATT) operates as a transmission line. The prior art has attempted to couple output power from the gain medium through an end contact, i.e. through a contact which intercepts the primary direction of energy propagation of the active medium. In the present invention, a side contact extends along the whole active region in a direction which is parallel to the principal direction of propagation of the energy in the active medium. Thus, the side contact plus the active region together can be considered as a single transmission line.

The present invention can be configured as an oscillator, amplifier, phase shifter, or attenuator. When configured as an oscillator, multiple short active regions can be sequentially coupled to a single long microstrip, which serves as the side contact for each of the active regions. This very simple power combining scheme provides extremely high power at millimeter wave frequencies.

6 Claims, 22 Drawing Figures

MONOLITHIC DISTRIBUTED IMPATT DIODE OSCILLATOR

MONOLITHIC DISTRIBUTED IMPATT DIODE OSCILLATOR

MONOLITHIC DISTRIBUTED IMPATT DIODE OSCILLATOR

CALCULATED GAIN RIPPLING EFFECTS CAUSED BY INPUT/OUTPUT IMPEDANCE MISMATCHES

DIMPATT DIODE OPERATING AS (a) FREE-RUNNING OSCILLATOR, (b) INJECTION-LOCKED AMPLIFIER

MONOLITHIC DISTRIBUTED IMPATT DIODE OSCILLATOR (a)

(b)

REALIZING AN INJECTION LOCKED IMPATT AMPLIFIER
USING NO CIRCULATORS (a) SINGLE STAGE (b) CASCADE $z_0 > z_3 > z_2 > z_1$

DISTRIBUTED IMPATT STRUCTURE

BACKGROUND AND SUMMARY OF THE INVENTION

The present invention relates to solid-state microwave devices including oscillators, amplifiers, phase shifters, and attenuators. In particular, the present invention relates to Avalanche-Transit-Time Devices.

Avalanche Transit-Time Devices provide a negative resistance which can in principle be used to operate at extremely high microwave frequencies, since the transit time which limits the frequency response is a transit time in a vertical direction, and can be therefore controlled by layer thickness. In addition, these devices are in principle capable of high power densities at extreme microwave and millimeter frequencies. However, the theoretical potential of such structures has in the past proved difficult to take advantage of, largely due to problems of external impedance matching, which have made it difficult to effectively couple power out of these devices, which are typically fabricated physically small to increase impedance levels. In particular, when they are configured as discrete devices, as is common, the individual IMPATTs (or other Avalanche Transit-Time Diode type) are physically tiny, (area being inversely proportional to frequency) and their assembly in a power-combining package will therefore typically contain significant mismatches due to assembly error, which lowers the maximum number of diodes which can be combined. It has therefore been difficult to combine enough IMPATTs to get usefully large amounts of power out at higher microwave and millimeter-wave frequencies, e.g. 94 GHz.

A further important consideration in the art of Avalanche Transit-Time Devices is that such devices are typically quite noisy. Thus, when such a device is to be used, e.g. as a local oscillator, the filtering which is required for reduction of device noise will impose significant additional loses on the already minimal output power of the device. Thus, output power for Avalanche Transit-Time Devices is generally at a premium.

It is an object of the present invention to provide an Avalanche Transit-Time Device such that the outputs of multiple devices can easily be combined for high power.

It is a further object of the present invention to provide a Avalanche Transit-Time Device having an easy and practical means for coupling the output power out.

The possibility of distributed semiconductor diode structures with negative resistance has been discussed in the prior art. The Hines paper, "High-frequency IMPATT-resistance circuit principles for Esaki diode applications", *Bell System Technical Journal* Volume 39, page 477 (1960), which is hereby incorporated by reference, is primarily directed to tunnel diodes (and does not mention IMPATTs), but does mention the possibility of a distributed semiconductor structure having gain. The Davydova et al. paper, "Linear Theory of an IMPATT Diode Distributed Microwave Amplifier," in *Telecommunications and Radio Engineering*, Part 2, Volume 27, page 112 (1972), which is hereby incorporated by references, does discuss the possibility of a distributed IMPATT. The Midford et al article, "A two-port IMPATT Diode Travelling-Wave Amplifier, which appeared at pages 1724 and 1725 of the *Proceedings of the IEEE* in 1968, provides a cursory description of an allegedly functional distributed-IMPATT device built in silicon. However, at the time of this article it had not yet been realized that the optimal conductivity for the contact (p+ and n+) layer in the IMPATT is not infinite. The Hambleton et al article "Design Considerations for Resonant Travelling Wave IMPATT Oscillator," *International Journal of Electrics*, Volume 35, pages 225-244 (1973) provided a greatly improved theoretical analysis of distributed IMPATT structure. Finally, the two Franz and Beyer articles, "The Travelling-Wave IMPATT mode," *IEEE Transactions in Microwave Theory and Techniques*, Volume MTT-26, page 861 (1978), and "The Travelling-Wave IMPATT mode: Part II-The Effective Wave Impedance and Equivalent Transmition," *IEEE Transactions in Microwave Theory and Techniques,"* Volume MTT-28, pages 215-218 (1980), taught what is now the standard theoretical analysis of distributed IMPATT operation. In particular, FIG. 10 of the second Franz and Beyer article sets forth the standard modeling for a distributed IMPATT structure as a transmission line with gain. This model is followed in the discussion of the present invention. All of these references are hereby incorporated by reference.

In a distributed IMPATT structure, power is coupled out through a side contact. That is, in previously proposed distributed IMPATT structures the gain medium (the active region of the IMPATT) operates as a transmission line. The prior art has attempted to couple output power from the gain medium through an end contact, i.e. through a contact which intercepts the primary direction of energy propagation (and also to the direction of maximum elongation) of the active medium. In the present invention, a side contact extends along the whole active region in a direction which is *parallel* to the principal direction of propagation of the energy in the active medium. Thus, the sidewall contact plus the active region together can be considered as a single transmission line.

The present invention can be configured both as oscillators and as amplifiers. When configured as an oscillator, multiple short active regions can be sequentially coupled to a single long microstrip, which serves as the sidewall contact for each of the active regions. This very simple power combining scheme provides extremely high power at millimeter wave frequencies.

According to the present invention there is provided a microwave device comprising:

a semiconductor diode active region interposed between frontside and backside contacts, said semiconductor active region defining a negative resistance diode between said frontside and backside contacts;

said semiconductor active region and said frontside and backside contacts being elongated in a first direction;

said frontside contact being extended beyond said active region in a direction normal to said first direction, to form a transmission line having a principal direction of propagation substantially parallel to said first direction.

BRIEF DESCRIPTION OF THE DRAWINGS

The present invention will be described with reference to the accompanying drawings, wherein.

DESCRIPTION OF THE PREFERRED EMBODIMENTS

The present invention is not by any means limited to distributed IMPATT diodes, but is in general applicable to a distributed realization of any 2-terminal device with gain. That is, applicable device types which may be realized in a distributed mode include not only IMPATTs and other Avalanche Transit-Time Devices (such as BARITTs, TUNNETTs, MITTATs, DOVATTs, heterojunction IMPATTs, etc.), but also transferred-electron devices (Gunn diodes, oscillators, etc.) and tunnel diodes. However, the presently preferred embodiment uses an IMPATT diode, and this embodiment will be discussed primarily. It should be noted that IMPATT diode have a particular advantage of good high-frequency characterisics and are preferable to many of the other 2-terminal device types for this reason. However, the scope of the present invention is not limited except as specified in the Claims.

A distributed IMPATT is basically a long strip of IMPATT diode. The depletion layer becomes a parallel plate wave guide which supports a travelling-wave. Due to the distributed nature of the device, the power-frequency limitations associated with lumped diodes do not apply. The devices can therefore be made much larger in area than the conventional IMPATTs giving high power handling capability.

Figure 1:
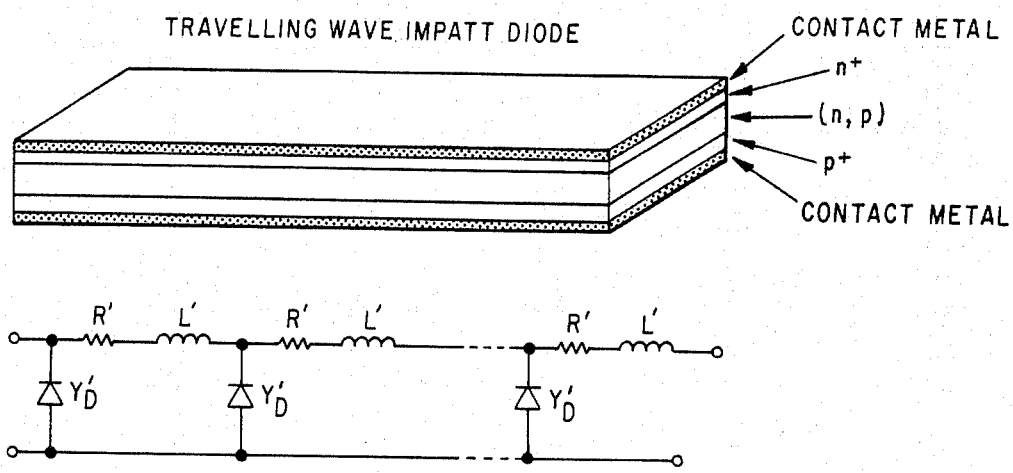
FIG. 1 shows a distributed IMPATT configuration generally, together with its circuit diagram.

A typical structure is shown in FIG. 1. The IMPATT structure is of single-drift type with the drift region made of n-type GaAs. The depletion region terminals (p+ and n+ layers) form the boundary for the waveguide. The device is *shunt* resonated at the depletion layer boundries, taking full advantage of the high negative conductance of the active layer.

Figure 15:
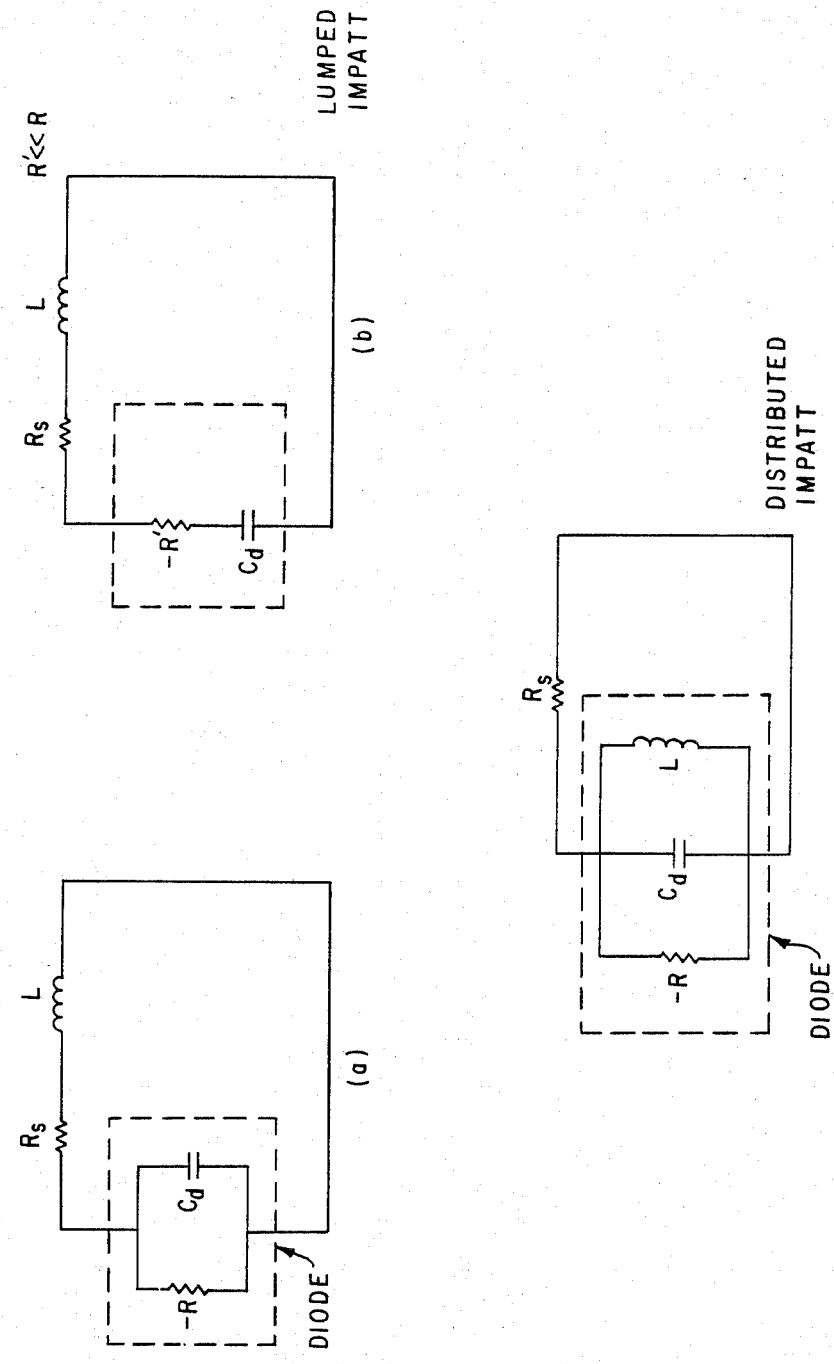
FIG. 15 compares equivalent circuits of distributed IMPATTs and lumped IMPATTs.

This is illustrated in more detail in FIG. 15. In 15a, the parallel connected −R and Cd represent the IMPATT. R is usually −500 or larger. In order to oscillate this device a load with positive real part and inductive imaginary part is needed. This is supplied by waveguide cavities. However, looking from the circuit side, the IMPATT is a series combination of negative resistance R′ and Cd (FIG. 15b) where R′ is about −5. Obviously, Rs which includes all the losses in the circuit and the diode as well as the load resistance, must be smaller than R′. In order to increase R′ the diode area is made very small and this in turn limits the power output.

In a distributed device, the waveguide is the depletion layer of the IMPATT and therefore it is shunt resonated as shown in FIG. 15. Cd and L components will be made to have equal magnitudes and Rs will now be limited by negative resistance R which is much larger than R′. Therefore, devices do not have to be small and no external resonant circuit is needed.

The key advantages of a travelling-wave IMPATT are at least two:

(1) High power capability due to increased device area for a given frequency.

(2) Built-in resonator capability. No external circuitry is, therefore, needed. In the millimeter-wave range this is an important consideration, since the resonant circuits become more difficult to design and produce than the IMPATT device itself.

Distributed IMPATTs can best be produced in a monolithic form for ease in manufacturing and integration. In the millimeter-wave range, the length and the width of the device are typically 1-5 mm and 10-100 microns respectively. This represents no particular problem in production. A tapered impedance transformer can be produced on SI GaAs to match the load and the device impedances. It is possible to use microstrip lines on 4 mil thick SI GaAs substrate up to at least 100 GHz, and even higher on thinner substrates.

Figure 10:
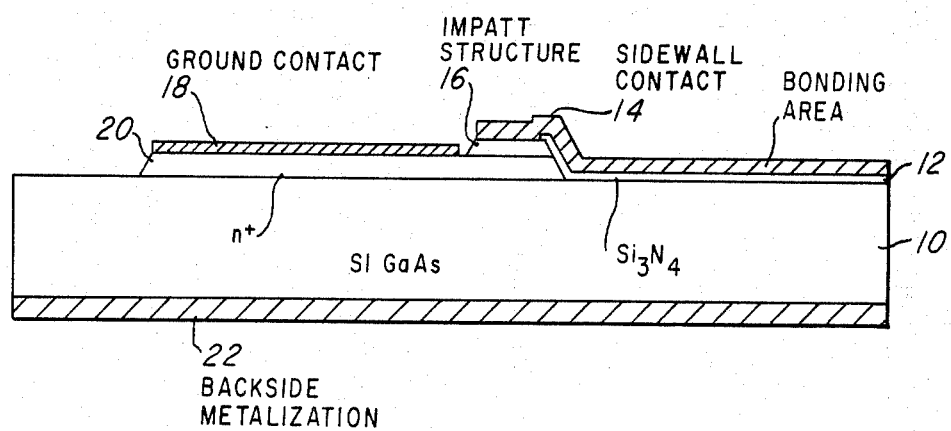
FIG. 10 shows a section through the IMPATT of the present invention, perpendicular to the direction of propagation of the transmission lines.

FIG. 10 shows a sectional view of a monolithic distributed device according to the present invention. A substrate 10 is provided, such as semi-insulating GaAs. Semi-insulating GaAs is preferred because it provides for convenient integration of a distributed device of the present invention with other monolithic microwave integrated circuit components such as FAT, reactors, etc. However, other substrates may be preferred for heat sinking. That is, alternative embodiments of the present invention could also be formed as miniature hybrid structures on diamond, copper, BeO, silver, or thick gold-plated substrate. In these case the fabrication is quite different, preferably using an AlGaAs etch stop to permit patterning of the contact layers). The importance of heat-sinking depends partly on the operation mode: that is, a pulse-mode operation at a low duty cycle imposes less stringent requirements on heat-sinking than high-duty-cycle or cw applications.

Atop the semi-insulating (e.g. chrome-doped) GaAs substrate 10 are formed an n+ layer 20 and an active device region 16. In the presently preferred embodiment, these layers are deposited by molecular beam epitaxy. However other methods well known to those skilled in the art may be used to form the structure. The semiconductor layers in the active region of the device of the present invention are not themselves novel, and a wide variety of prior-art semiconductor structures may be used. The presently preferred embodiment uses a conventional double-shift IMPATT structure, wherein a backside contact layer 20 which is heavily doped is overlaid by an n-type drift region 22, a p-type drift region 24, and a p+ contact region 26. In the presently preferred embodiment, for operation in the neighborhood of 50 GHz, the drift regions 22 and 24 are each about 300 nano-meters thick. This thickness will be preferably scaled according to frequency, as is well known to those still in the art. For example, for operation at 94 GHz, the layers 22 and 24 would each be approximately 200 nanometers thick, and of higher doping density. In the presently preferred embodiment, the doping density of the layers 22 and 24 is each approximately 2 E 17 per cc, but, as well known to those skilled in the art, different doping levels can be chosen. The doping and thickness of these layers are preferably chosen so that the depletion layer surrounding the junction between layers 22 and 24 spreads just to the edge of the contact layers 20 and 26 at the breakdown voltage (which is lower than the operating voltage).

In the presently preferred embodiment the p+ layer 26 is reasonably thin, e.g. 200 nm, but this thickness could be varied. It is essential that the p+ contact layer 26 be thinner than the skin depth at frequencies of interest, but this is not an important constraint, since, for GaAs, the skin depth at 94 GHz is several microns.

Figure 11:
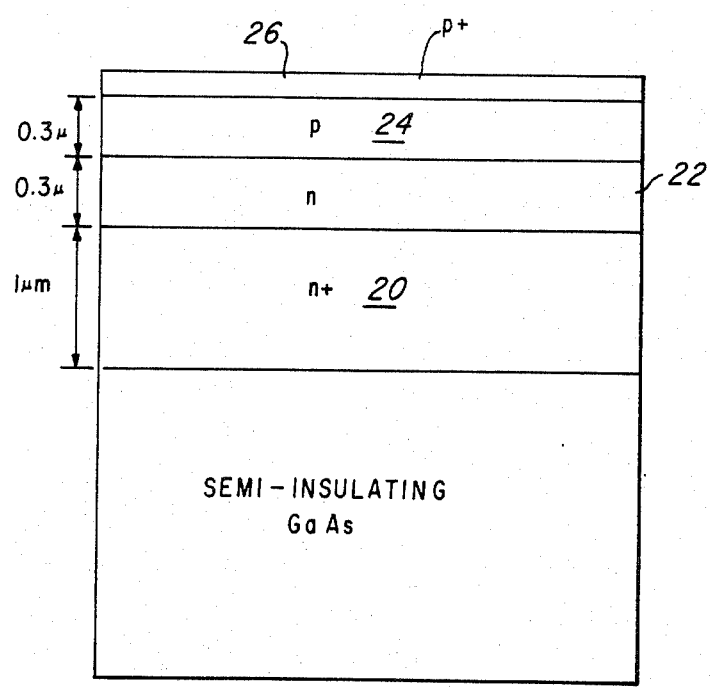
FIG. 11 shows the device structure used, in the presently preferred embodiment, for the active region of a double-drift monolithic distributed IMPATT.
Figure 12:
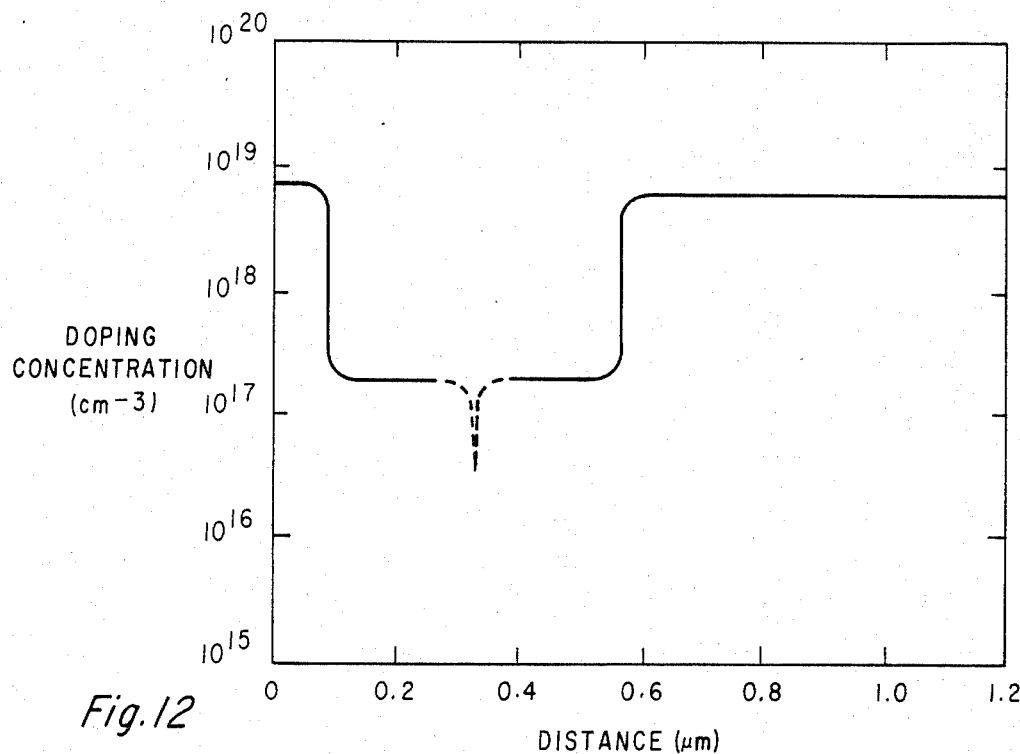
FIG. 12 shows the doping profile corresponding to the structure of FIG. 11.
Figure 13:
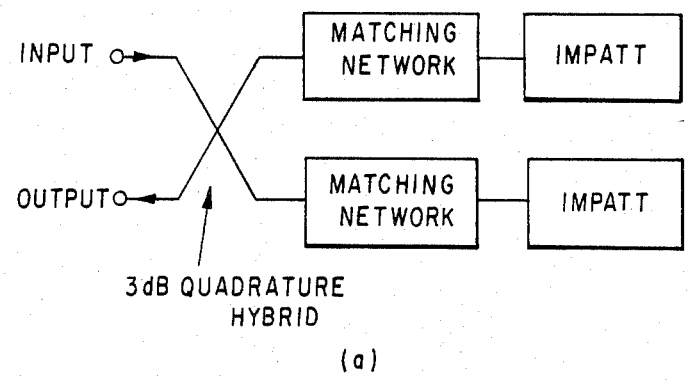
FIG. 13 shows how multiple IMPATTs according to the present invention can be combined in an injection-locked amplifier.
Figure 13:
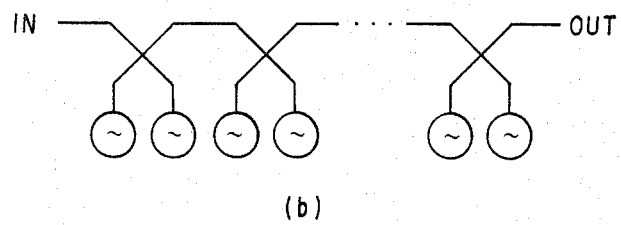
Figure 14:
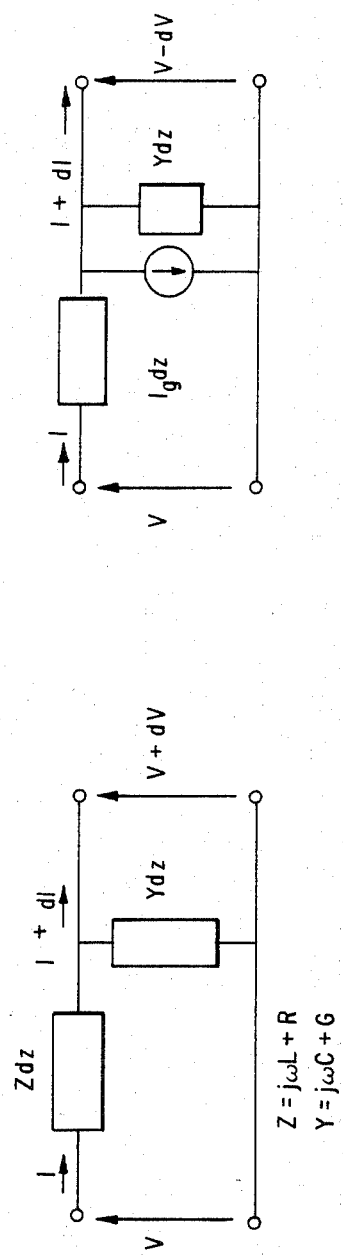
FIG. 14 shows the equivalent circuit of a distributed IMPATT diode.

The n+ contact layer 20 is preferably thick, but this is done for convenience in the device fabrication steps used. As seen in FIG. 10, a double mesa structure is preferably used. That is, after all layers through layer 26 are deposited, the first mesa etch step is performed to define a large mesa. The large mesa corresponds to the width shown for contact layer 20 in FIG. 10. A second mesa etch is then performed to remove the active region 16 (i.e. layers 22, 24, and 26) from the portion of n+ contact layer 20 where the ground contact metallization 18 is typically deposited. Subsequently, a silicon nitride layer 12 is deposited and patterned, and a side contact 14 and ground contact 18 are patterned to provide front and back contacts to the four-layer structure shown in FIGS. 11 and 12. The back-side metallization 22 is provided merely as an Rf ground plane, and to assist heat-sinking and mounting.

Figure 3:
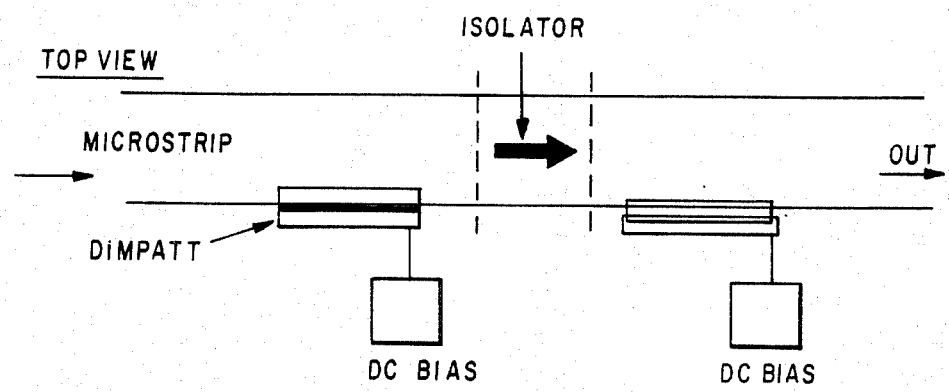
FIG. 3 shows an embodiment wherein a distributed IMPATT according to the present invention is combined with other millimeter wave circuit elements through a microstrip transmission line.
Figure 2:
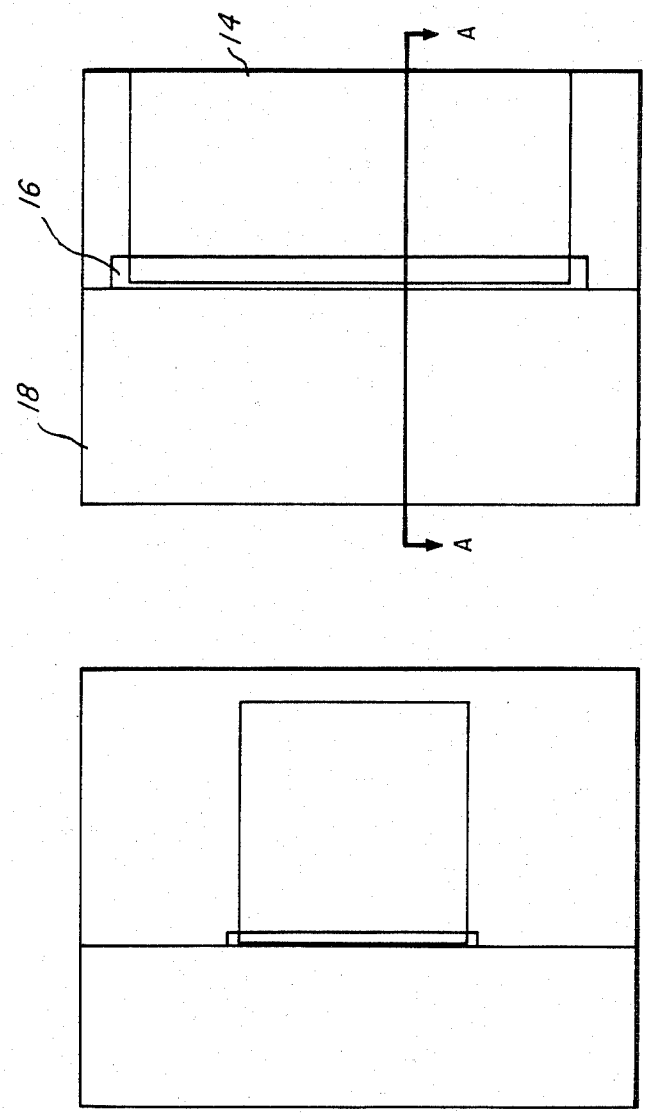
FIG. 2 shows the distributed IMPATT configuration of the present invention, wherein a extended side coupler is used.

A plan view of the distributed device according to the present invention is shown in FIG. 2. The view shown in FIG. 10 corresponds to a sectional view along section a—a. A side coupler 14 operates as a transmission line, propagating energy in the direction shown by the arrow. Thus, the side coupler of 14 can itself be converted to a microstrip line, and provide coupling to other circuit elements. One example of a monolithic microwave circuit incorporating the distributed diode of the present invention as shown in FIG. 3.

As shown in FIG. 2, the diode active region 16 is highly elongated. For example, in the presently preferred embodiment this diode is 10 microns wide, but may be millimeters in length.

Figure 6:
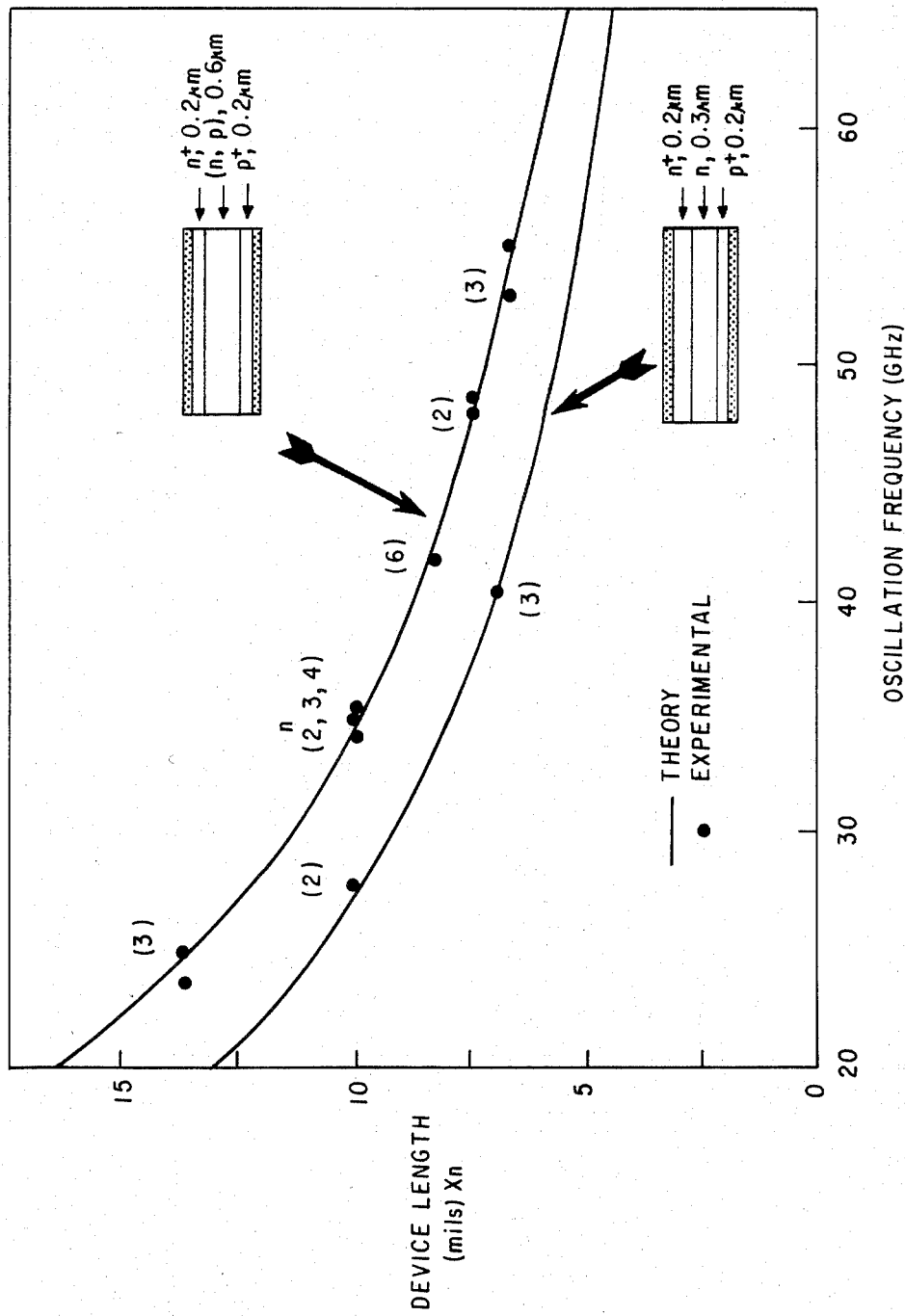
FIG. 6 shows the relation between device length and fundamental-mode oscillation frequency, for several devices constructed according to the present invention.
Figure 7:
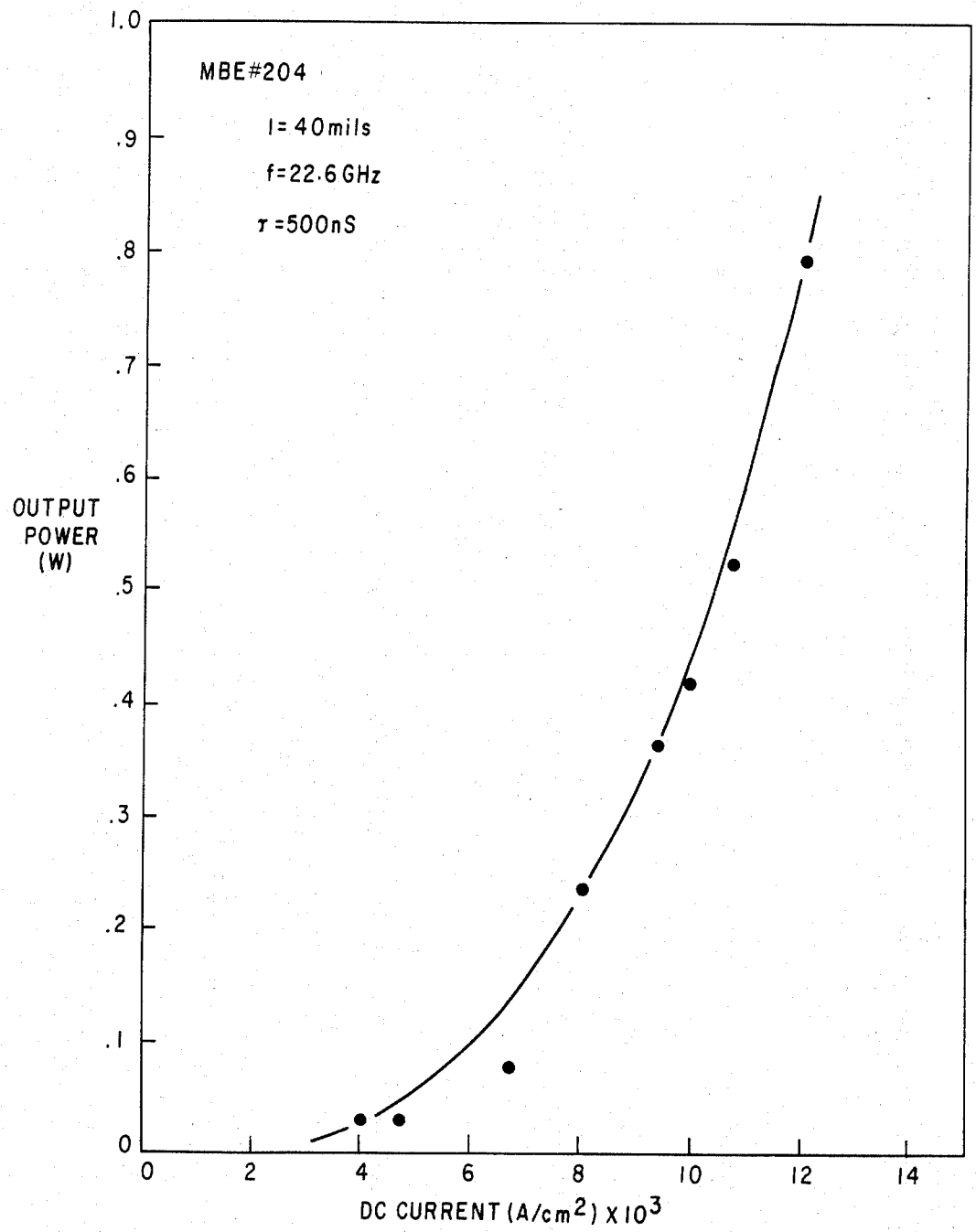
FIGS. 7 and 8 show sample relations of output power to dc bias current.
Figure 8:
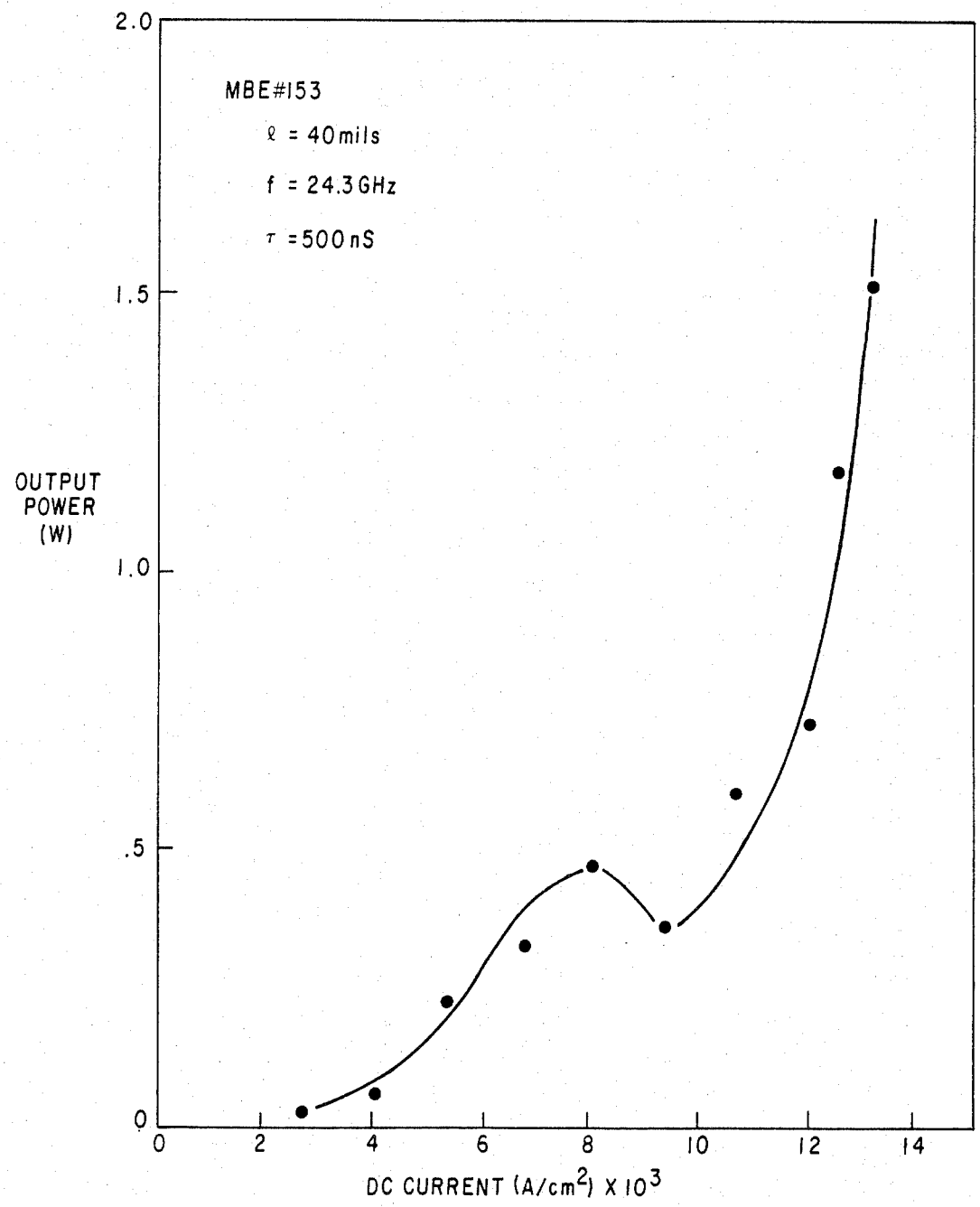
Figure 9:
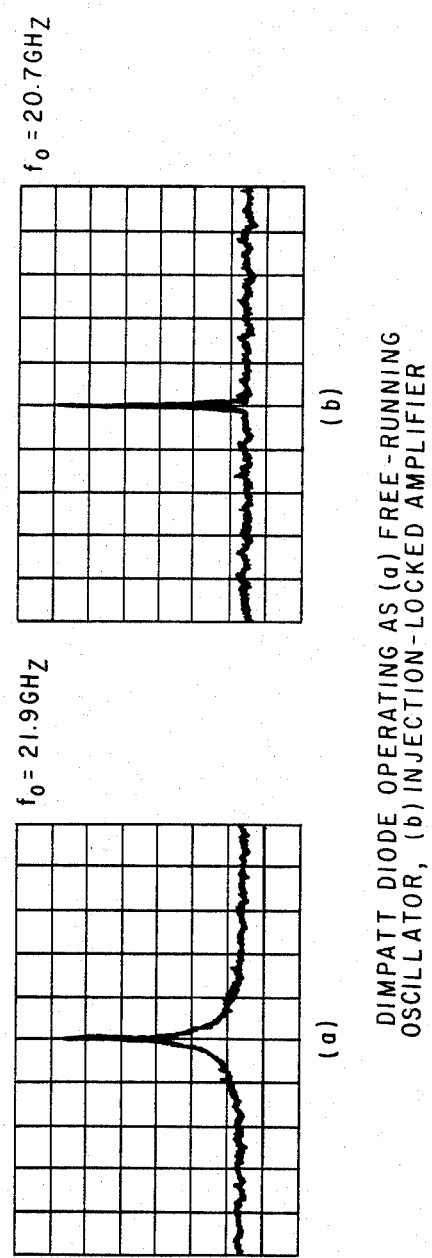
FIGS. 9a and 9b show the difference in Q between an IMPATT device according to the present invention operating as a free running oscillator (FIG. 9a), and an IMPATT device according to the present invention operating as an injection-locked amplifier (FIG. 9b)

When the diode is being operated as an oscillator, the fundamental resonant frequency of a diode is determined by its length, as shown in FIG. 6.

Figure 4:
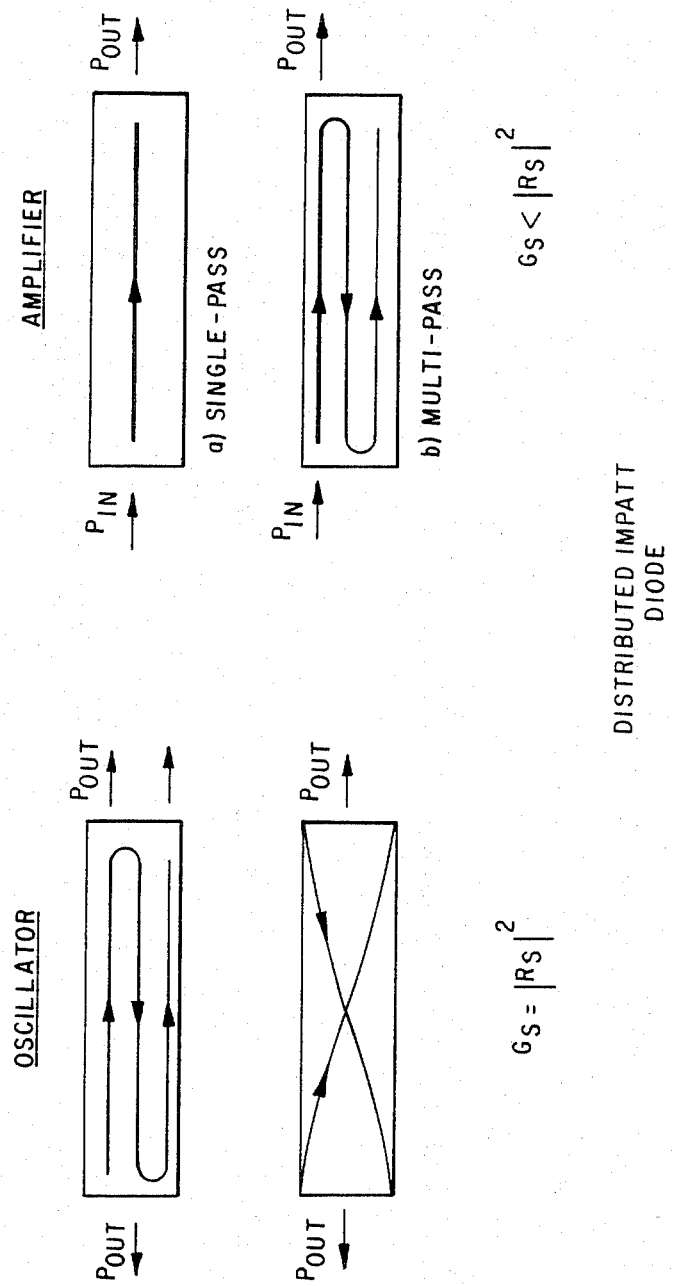
FIG. 4 shows how the relation between single pass gain and single-pass reflection coefficients determines whether a distributed device function as an oscillator, as a multi-pass 2-port amplifier, or effectively as a single-pass 2-port amplifier.

As seen in FIG. 4, the relation between single pass gain and the endpoint reflection coefficient determines whether a simple diode will act as an oscillator or an amplifier. If the single-pass voltage reflection coefficient squared is equal to the single-pass gain, the device will settle into a standing wave condition and will function as an oscillator. That is, if the single pass gain initially exceeds the reflection coefficient squared, the signal levels within the device rise until saturation begins to limit the gain, so that the equality condition is satisfied. On the other hand, if the reflection coefficient squared exceeds the single-pass gain, then the device will function as a multi-pass amplifier. If the reflection coefficent greatly exceeds the single-pass gain, then the amplification will effectively be single-pass amplification.

Figure 5:
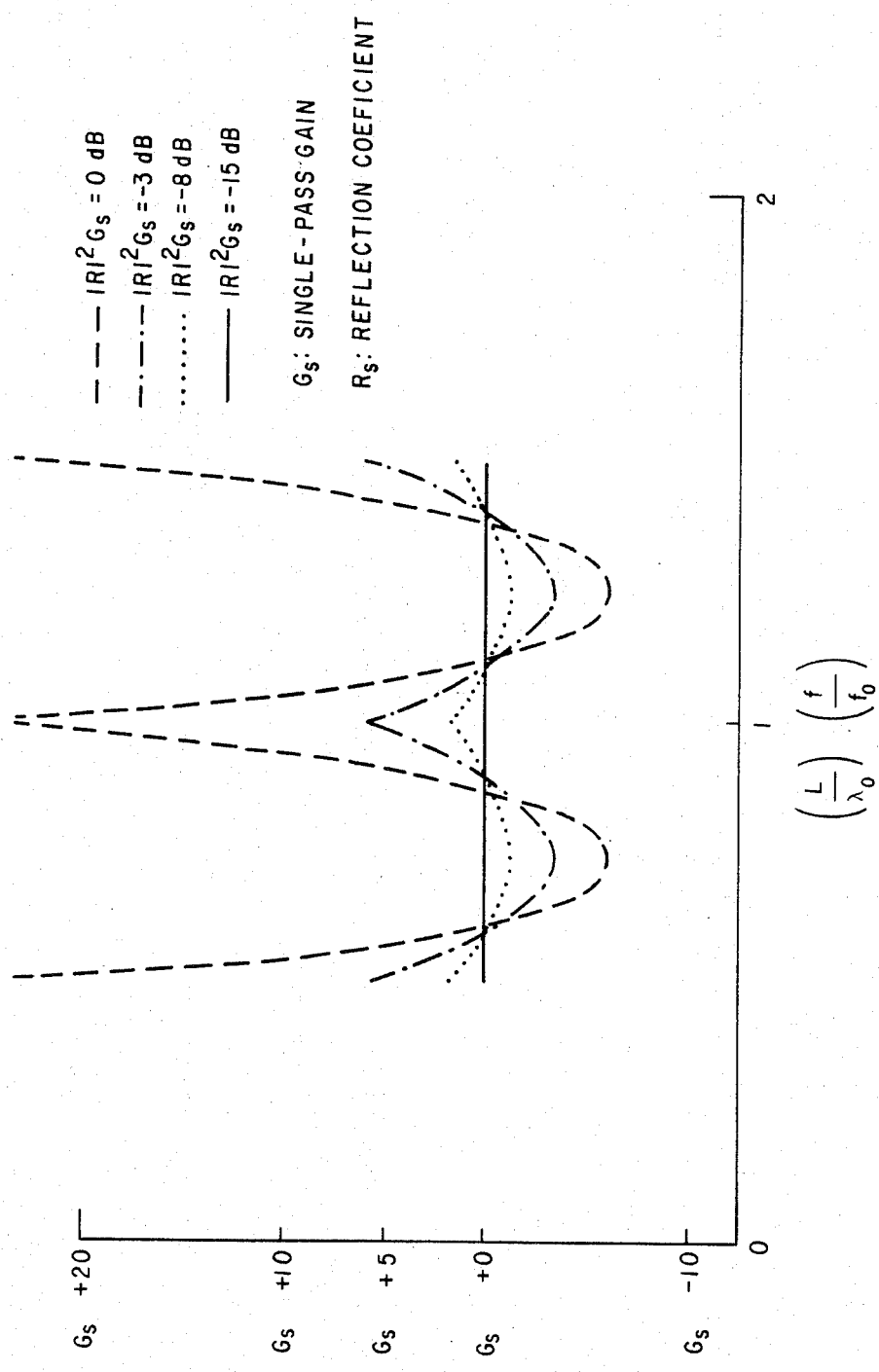
FIG. 5 shows curves showing frequency response characteristics of an oscillator, a single-pass amplifier embodiment, and two multi-pass amplifier embodiments, as related to the relation between single-pass gain and single-pass reflection coefficient.

These various operating modes imply different degrees of frequency selectivity. As shown in FIG. 5, an amplifier which is operating as single-pass will not be frequency selective, as shown by the solid curve. However, multi-pass amplification introduces increasing amounts of ripple, and the oscillator condition provides resonance.

FIG. 6 shows some sample implementations of the present invention, indicating the dependence of the fundamental mode of oscillating frequency on the device length. As noted, it is preferable to optimize the thickness of the drift regions (the lightly doped region between the heavily doped contact layers in an IMPATT device) for the operating frequency desired.

It is possible to get spatial harmonics in a cavity mode resonantor, but this tends not to be a major problem in distributed IMPATTS according to the present invention, because of the frequency-selectivity due to the thickness of the drift regions. Of course, in an extremely long device with appropriately shallow drift regions, the harmonics could be close enough together to have multiple stable oscillation frequencies. If it were desirable to configure a millimeter-wave comb filter, it could be done in this fashion.

In addition, the resonant frequency is somewhat sensitive to the thickness and doping of the contact layers 20 and 26. These contact layers load the transmission line, and therefore can lower the phase velocity of propagation in the transmission line and lowering the resonant frequency.

Figure 16:
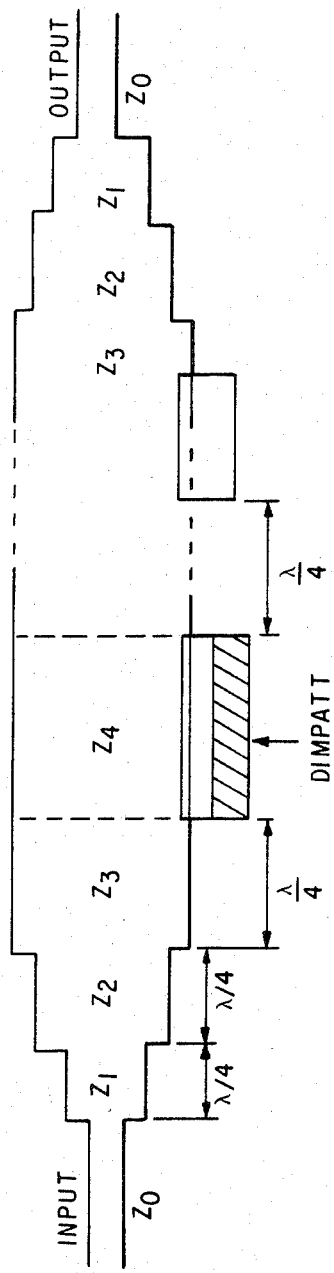
FIG. 16 shows impedance-matching transitions used to couple a microstrip having imput impedance ZO to a distributed IMPATT diode according to the resent invention having a lower impedance.

Depending on the DIMPATT characteristic impedance, the side coupling microstrip characteristic impedance may need to be small. In this case, it is desirable to transition from standard 505L transmission line at the input to low impedance 23 in several lambda/4 transformers. (lambda corresponds to the wavelength in the microstripe at the center frequency of frequency band). Multi-section transformers give broader band impedance matching. A similar x/4 transformer sections increase characteristic impedance level at the output terminal. Figure 16 shows this conjunction; preferably the impedances increase geometrically.

Figure 17:
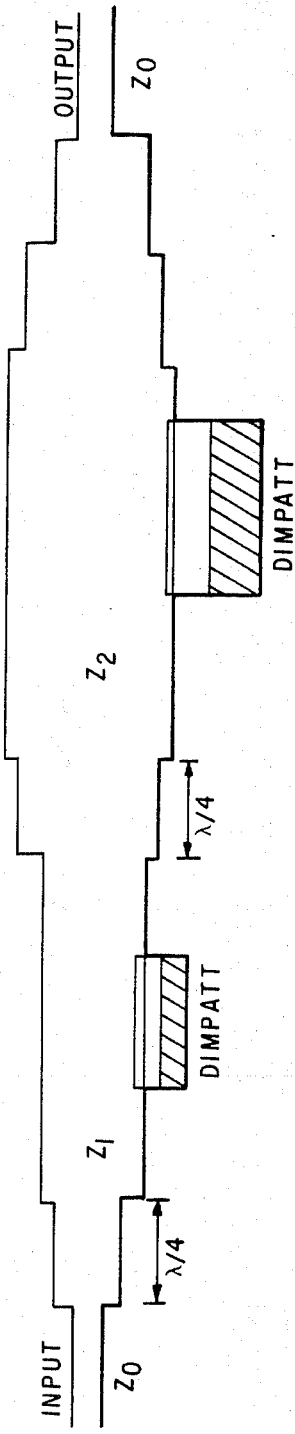
FIG. 17 shows a power-combining circuit, including microstrip impedance-matching transformations between two distributed IMPATTs according to the present invention having different respective widths.

For specific applications it may be desirable to change DIMPATT width, in other words, use wider devices closer to the output end, to ensure that each device experiences similar power densities. In this case it may be desirable to couple devices closer to input prior at a different impedance level than those closer to output, as shown in FIG. 17.

Figure 18:
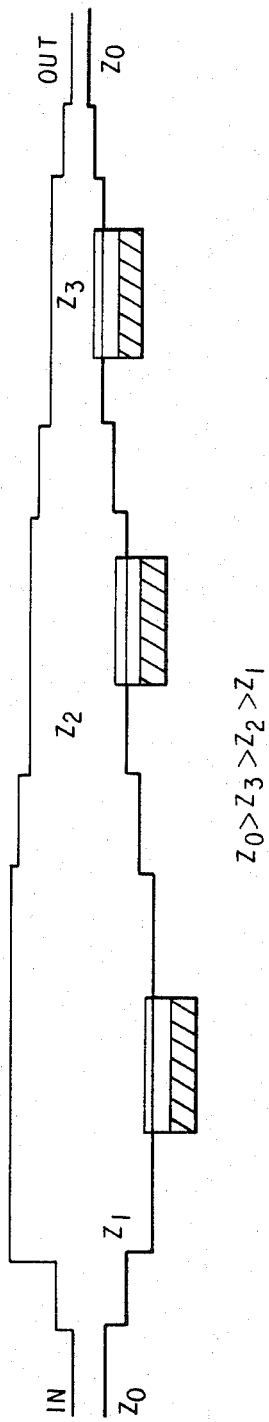
FIG. 18 shows a different power-combining scheme, wherein plural distributed IMPATTs according to the present invention are more weakly coupled to the microstrip regions wherein the power is higher.

Alternatively similar size diodes can be used, but with the coupling changed towards the output. This can be achieved, as shown in FIG. 18, by again changing the characteristic impedance of the microstrip. Near the input port, better impedance match is supplied so that the device is strongly coupled. The second device is less strongly coupled and the last device is weakly coupled.

In this fashion, as the wave moves towards the output port, less of it propagates through the active medium of the DIMPATT. Although a lesser portion is going through the last device, the absolute value of power density in each device can be same since the wave propagating in the microstrip is gaining in power.

The two approaches are somewhat similar. The difference is that the de-coupling is achieved in one by changing line impedance, and in the other, by changing device impedance.

Alternatively, where it is desired to ensure oscillatory behavior, this can again be accomplished by patterning of the side coupler 14 to assure an impedance discontinuity at the end of the active region 16.

Another way of ensuring single pass amplification activity is to use a magnetic field with a ferrite substrate, to ensure directionality. That is, as is well known in the art, if the substrate 10 is made of a ferrimagnetic material, and a dc bias magnetic field is applied normal to the plane of the substrate, wave propagation will preferentially occur in one direction, so that the device of the present invention will simply act as a single-pass 2 port amplifier.

To combine multiple oscillators or amplifiers according to the present invention, they can simply be connected in series along a transmission line. That is, the sidewall coupler 14 can be extended to provide a microstrip transmission line, with a plurality of active regions 16 spaced along it.

As the active region 16 is made wider, the power handling capacity naturally increases. However, if the active region 16 is made too wide, the characteristic impedance of the device becomes small and effective impedance matching at input/output ports becomes more difficult.

A practical upper limit for device length is about one tenth of one wavelength of the electromagnetic wave propagating in the device. For a given area device, length/width ratio should be kept as large as possible to reduce thermal impedance without exceeding the specific limits imposed on the device length. Devices operating as oscillators need to be of specific lengths whereas those operating as amplifiers, phase shifters or attenuators can be of varying length depending on application needs. The gain of an amplifier, the phase shift of a phase shifter, or the attenuation of an attenuator is a strong function of device length. (Also, to suppress unwanted oscillators, the device length should be chosen such that the IMPATT action cannot supply adequate gain at the frequency which would be suitable for oscillators dictated by device length.)

Figure 19:
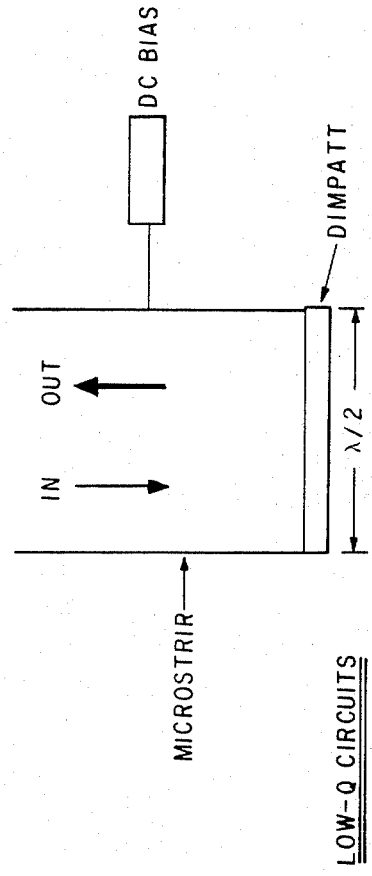
FIG. 19 shows a further embodiment of the present invention, wherein the side contact is still uninterrupted along the length of the active diode region, but is extended as a wide microstrip line in a direction normal to the propagation direction of the distributed IMPATT.
Figure 20:
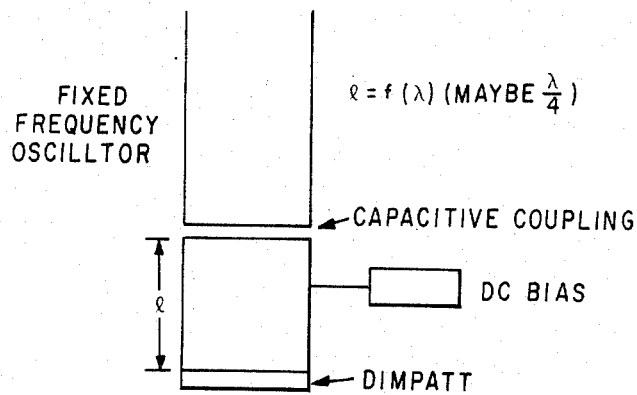
FIG. 20 shows a further way of coupling energy from an oscillator according to the present invention, wherein the coupling is again performed through a wide microstrip extending normal to the long direction of the IMPATT diode.

Thus, the key teaching of the present invention is that power is coupled out of a distributed negative resistance diode using a side contact which is coupled to the diode along substantially all of the length of the diode active region. This teaching, which has fundamental novelty, can be modified and varied to provide a wide range of embodiments. While the most preferred embodiments couple the distributed IMPATT to a microstrip lining having a propagation direction parallel to the long direction of the diode, as shown in FIG. 3, embodiments such as FIGS. 19 and 20 couple the IMPATT to a wide microstrip line extending normal to the long dimension of the diode.

Figure 21:
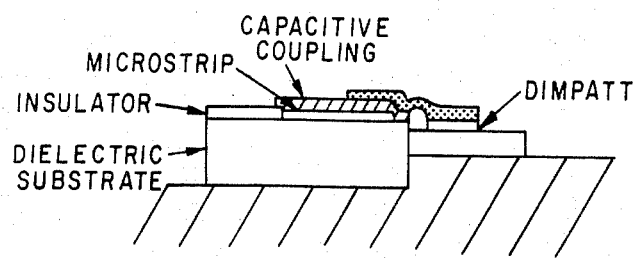
FIG. 21 shows a further embodiment of the present invention, wherein the sidewall contact is capacitatively coupled, but not d.c. coupled, to an extended microstrip line running parallel to the IMPATT diode region.

The side contact of the distributed diode of the present invention can be d.c. coupled as a microstrip transition line, but it is alternatively possible to capacitatively couple the sidewall contact to a microstrip transmission line, as shown in FIG. 21. Under strong coupling conditions, the Q of the distributed IMPATT is lowered, and the distributed IMPATT device can therefore be injection locked over a wide frequency range. Additional devices can be coupled with the same microstrip line. In order to achieve nonreciprocity, in addition to the methods noted above, isolators may be inserted between the distributed IMPATT devices.

Thus the present invention provides a fundamental innovation in the art of microwave devices, having as advantages all of the above enumerated objects of the invention. While the present invention has been described with reference to one particular embodiment, it teaches a general concept of very broad applicability. The present invention is therefore not limited except as specified in the accompanying claims, which are to be construed broadly.

What is claimed is:

1. A microwave device comprising: A semiconductor diode active region interposed between frontside and backside contacts, said semiconductor active region defining a negative resistance diode between said frontside and backside contacts;

said semiconductor active region and said frontside and backside contacts being elongated in a front direction;

said frontside contact being extended beyond said active region in a direction normal to said first direction, to form a transmission line having a principal direction of propagation substantially parallel to said first direction.

2. The microwave device of claim 1, wherein said frontside contact is capacitatively coupled to a microstrip line, said microstrip line extending beyond said active region in a direction substantially parallel to said first direction.

3. The device of claim 1, wherein said negative resistance diode is IMPATT diode.

4. The device of claim 3, wherein said IMPATT diode is a double-drift IMPATT diode.

5. The device of claim 2, wherein said microstrip is impedance-matched to said diode.

6. The device of claim 5, wherein said microstrip line is impedance-matched to a plurality of said active diode regions, said plural active diode regions each comprising different widths.

* * * * *